3,838,071
Patented Sept. 24, 1974

3,838,071

HIGH ADHESION SILVER-BASED METALLIZATIONS

Rajnikant Babubhai Amin, Wilmington, Del., assignor to E. I. du Pont de Nemours and Company, Wilmington, Del.

No Drawing. Filed June 30, 1972, Ser. No. 268,054
Int. Cl. H01b *1/02*
U.S. Cl. 252—514 16 Claims

ABSTRACT OF THE DISCLOSURE

In silver and palladium/silver-based metallizations also containing inorganic binder for producing high adhesion conductors on dielectric substrates, improved metallizations for producing conductors of enhanced thermal aged adhesion, additionally comprising certain crystalline inorganic polynary oxides of copper, e.g., $Cu_2Al_2O_4$, $Cu_3TiO_5$, etc. Dielectric bodies having such conductors fired thereon.

BACKGROUND OF THE INVENTION

This invention relates to electronics, and more particularly, to improved conductor compositions for producing circuits therein.

Silver or palladium/silver metallizations are widely used for hybird microelectronic circuits. Normally the metallization composition comprises silver powder or palladium/silver powders; inorganic binder such as glass frit, bismuth oxide, etc.; and an optional inert liquid vehicle to provide desired printing characteristics. The composition is usually printed on a ceramic substarate such as aluminum oxide, dried and fried at high temperatures (above 600° C.). During firing the organic components in the vehicle burn off and the metallization bonds to the ceramic substrate. Active and passive components are attached to the metallized area by soldering and other methods. It is important that the components adhere well to the circuit during the life of the circuit, even at elevated temperatures. Thermal ageing and adhesion measurement is an important test for such metallizations.

Soldered silver metallizations show considerable reduction in adhesion (to dielectric substrates) after thermal ageing. In general, palladium/silver metallizations having greater amounts of silver show more pronounced thermal ageing than do those having less silver.

In a common test soldered metallizations are aged at 120–150° C. for 48 hours; after ageing silver/palladium metallizations may show a drop in adhesion up to 80% of that of unaged samples. A complex phenomenon takes place during the ageing. It is believed that at elevated temperatures tin from solder reacts with silver-containing metallizations and weakens the metallization-ceramic bond.

SUMMARY OF THE INVENTION

In metallizations of a finely divided noble metal powder of silver or palladium/silver and an inorganic binder, useful for application to dielectric substrates followed by firing to produce conductor patterns, this invention is improved metallizations which result in fired patterns of high adhesion to the substrate; the improved metallizations comprising, in addition to noble metal and binder, a finely divided inorganic polynary crystalline oxide compound of copper which melts above 1000° C., in an amount effective to improve aged adhesion of the resultant conductor to the substrate. The mealltizations may be dispersed in an inert liquid vehicle.

The metallizations preferably are those wherein the amount of the copper compound is 0.5–10% of the weight of noble metal powder.

Preferred copper compounds are $Cu_2Al_2O_4$, $Cu_3TiO_5$, $CuO \cdot Fe_2O_3$, $CuO \cdot Mn_2O_3$, $CuO \cdot Co_2O_3$, and $Cu_2O \cdot Cr_2O_3$. Optimum copper compounds are $Cu_2AlO_4$ and $Cu_3TiO_5$.

This invention also involves dielectric substrates having such metallizations fired thereon.

DETAILED DESCRIPTION OF THE INVENTION

The essential component in the improved metallizations of the present invention is a copper compound. Specifically, it is a crystalline inorganic polynary oxide compound of copper melting above 1000° C. By "polynary" it is meant that the inorganic compound contains three or more elements, that is, in addition to copper and oxygen, at least one other element is present therein. Such elements comprise, for example, aluminum (e.g., in $Cu_2Al_2O_4$), titanium (e.g., in $Cu_3TiO_5$), iron (e.g., in $CuO \cdot Fe_2O_3$), manganese (e.g., in $CuO \cdot Mn_2O_3$), cobalt (e.g., in $CuO \cdot Co_2O_3$), chromium (e.g., in $Cu_2O \cdot Cr_2O_3$), etc. Such compounds may preferably be described as selected from the class consisting of $Cu_2Al_2O_4$, $Cu_3TiO_5$, $CuO \cdot Fe_2O_3$, $CuO \cdot Mn_2O_3$, $CuO \cdot Co_2O_3$, $Cu_2O \cdot Cr_2O_3$. Optimum copper compounds of this invention are $Cu_2Al_2O_4$ (copper aluminate), which, of course, may also be written as $CuAlO_2$, and $CuAiO_5$ (copper titanate).

The function of the copper compound is to improve the thermal aged adhesion of fired silver and silver/palladium metallizations. Preferably, the amount of said copper compound is 0.5–10%, by weight, based on the weight of noble metal (Ag and optional Pd) in the composition. This maximum is prescribed for the copper compound since at higher levels thereof, solderability of the resultant fired conductor is too low for most applications.

The invention relates to metallizations useful for printing conductor patterns on dielectric substrates, usually ceramic dielectric substrates. The conductive component of the metallization is finely divided silver powder, or a mixture of finely divided silver powder and palladium powder. Where a palladium silver mixture is used, the amount of palladium used will depend upon the desired characteristics of the metallization, such as melting point, conductivity, reactivity with solder, cost, etc. Generally, up to 40% of the total weight of palladium and silver may be palladium. Stated another way, the noble metal content of the metallizations will generally contain 0–2 parts of palladium per 3 parts of silver, by weight.

The inorganic binder conventionally used with surface conductors where high adhesion is desired include any inorganic material which serves to bind metal to the substrate, including glasses, metal oxides and precursors of glass and oxides. The conventional glass frits such as lead borates, lead silicates, lead borosilicates, cadmium borates, lead cadmium borosilicates, zinc borosilicates and sodium cadmium borosilicates are exemplary. Selection of the binder, and the amount of binder to be used, is well within the skill of the art, and depends upon the desired fired conductor properties. Normally up to 15% binder is used, since more binder would reduce solderability too greatly. All of the solid components (metal, frit, copper compound) in these metallizations should be in finely divided or powder form, that is, in the form of powders sufficiently finely divided to pass through a 325-mesh (U.S. standard sieve scale) screen. Thus, the powder has no particles larger than about 40 microns in diameter. Generally, the powder will have an average particle size not exceeding 20 microns. Desirably the average particle size of the metals will be in the range 0.1–5 microns, while it is preferred that the average particle size of the frit be in the range 1–15 microns.

The metallization solids may be dispersed in an inert liquid vehicle, as is conventional in the art, to produce metallizing compositions, by mechanical mixing. The solids/vehicle ratio and the nature of the vehicle selected will depend upon the desired paste properties, and to some etxent will depend upon the method of application of the dispersion to a substrate (e.g., by screen stenciling, spraying, dipping, brushing, etc.). The selection of vehicle and solids/vehicle ratio is within the skill of one versed in the art.

Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, $\alpha$- and $\beta$-terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate. Alternately, the vehicle may contain waxes, thermoplastic resins or like materials which are thermofluids, so that the vehicle containing metallizing composition may be applied at an elevated temperature to a relatively cold ceramic body upon which the metallizing composition sets immediately.

The ratio of inert vehicle to solids in the metallizing compositions of this invention may vary considerably and depends upon the manner in which the dispersion of metallizing composition in vehicle is to be applied and the kind of vehicle used. Generally, from 1 to 20 parts by weight of solids per part by weight of vehicle will be used to produce a dispersion of the desired consistency. Preferably, 4–10 parts of solid per part of vehicle will be used. Optimum dispersions contain 30–70% liquid vehicle.

As indicated above, the metallizing compostions of the present invention are printed onto ceramic substrates, after which the printed substrate is fired to mature the metallizing compositions of the present invention, thereby forming electrically continuous conductors.

EXAMPLES

The following examples are given to illustrate the present invention. In the examples and elsewhere in the specification and claims, all parts, percentages, ratios, etc., are by weight. In the examples the vehicle employed to make dispersions of the metallizing compositions was 90% $\beta$-terpineol and 10% ethyl cellulose. The noble metals employed had an average particle size in the range 0.1–5 microns; the copper compounds passed through a 325 mesh screen. The particle size of the inorganic binders used was in the range 5–44 microns. The glass frits employed in the examples had the following compositions (weight percent): Frit A, 37.5 $SiO_2$, 43.5 PbO, 9.8 CaO, 4.3 $Al_2O_3$, 4.9 $B_2O_3$. Frit B, 14.3 $SiO_2$, 2.3 $Al_2O_3$, 59.6 CdO, 16.5 $B_2O_3$, 7.3 $Na_2O$.

The thickness of the fired metallizations was about 10–20 microns.

Copper titanate was prepared as follows. One mole of $TiO_2$ was mixed with 3 moles of CuO and this mixture was sintered at 1050° C. for 4 hours. The sintered aggregates were broken and the powder was sintered again at 1050° C. for 4 hours. The sintered product was ball milled and sieved through a 325 mesh sieve.

Copper aluminate was prepared as follows. One mole of $Cu_2O$ was mixed with two moles of $Al(OH)_3$. The mixture was sintered at 1250° C. for 4 hours. The aggregates were broken and the product was resintered at 1250° C. for 4 hours. The sintered product was ball milled for 16 hours and sieved through a 325 mesh sieve.

Examples 1–2; Showing A

Metallizing compositions of silver and palladium powders and inorganic binders were prepared with (Examples 1 and 2) and without (Showing A) copper aluminate, and the respective adhesion performances were evaluated. The composition of Example 1 contained 4.39% $CuAlO_2$ based on Pd/Ag weight; that of Example 2, 2.33% $CuAlO_2$.

The paste components set forth in Table I were blended on a roll mill; the data in Table I show the improved performance of the present invention in similar tests.

The three compositions were printed (200 mesh screen) as sixteen squares of 0.1 inch by 0.1 inch area on 1 inch by 1 inch by 0.025 inch thick 96% aluminum oxide ceramic chip. The printed ceramic chips were dried at 100° C. for 15 minutes and then fired at 850° C. for 10 minutes in a belt furnace. The fired ceramic chips were dip soldered (62 Sn/36 Pb/2 Ag) at 215° C. with a 26 gauge wire placed on the metallized areas of each of four rows of four squares, each 0.1 inch square. Adhesion was measured on a Chatillon pull tester by attaching the soldered wire to the tester (at 90°) and pulling at 0.5 in./min. pull rate. Aged and unaged adhesion results are summarized in Table I. The adhesion values are averages for 16 samples. It was noted that the metallizations of Examples 1 and 2, with coppel aluminate, had aged and unaged adhesion values greater than 7.5 pounds. It was found that the 26 gauge wire itself breaks at 7.5 pounds force.

TABLE I

Metallization compositions (wt. percent); adhesion evaluation

| | Showing A | Example 1 | Example 2 |
|---|---|---|---|
| Silver powder | 62.76 | 52.0 | 53.0 |
| Palladium powder | 5.46 | 7.0 | 7.0 |
| Glass frit powder A | 2.33 | 4.0 | 4.0 |
| Bismuth oxide powder | 5.61 | 8.0 | 8.0 |
| Vehicle | 23.84 | 26.0 | 26.0 |
| Copper aluminate | | 3.0 | 2.0 |
| Adhesion, unaged (lb./0.01 sq. inch) | 4.0 | >7.5 | >7.5 |
| Aged adhesion 120° C./64 hrs. (lb./0.01 sq. inch) | 3.3 | >7.5 | >7.5 |
| Solderability | Excellent | Excellent | Excellent |
| Conductivity (milliohms/square) | 9 | 20 | 16 |

Showing A composition, without the copper aluminate, showed lower aged and unaged adhesion values of 4.0 pounds and 3.3 pounds, respectively. The solderability of the composition containing copper aluminate were not adversely affected by the presence of the copper compound, and the conductivity was acceptable.

Example 3; Showing B

To the paste composition of Showing A there was added 3%, by weight of the total composition, of copper aluminate (Example 3), or 4.3% $Cu_2Al_2O_1$ based on weight of Pd/Ag. Evaluation of the paste was conducted as in Showing A, except that ageing was performed at 150° C. for 44 hours, instead of 120° for 64 hours. The composition of Showing A was reevaluated under the same conditions as Example 3 (Showing B). The data are reported in Table II.

TABLE II

| | Showing B | Example 3 |
|---|---|---|
| Adhesion, aged (lb./.01 sq. in.): Average of 16 samples | 2.0 | 5.5 |
| Low | 1.0 | 3.8 |
| High | 3.0 | 7.0 |
| Solderability | Excellent | Excellent |
| Conductivity (milliohms/square) | 9 | 20 |

Examples 4 and 5; Showings C and D

Example 4 and Showing C employ pastes of silver powder, Showing C without $Cu_2Al_2O_4$ and Example 4 with 1.63% (by weight) $Cu_2Al_2O_4$ based on the weight of silver. Example 5 and Showing D employ Ag/Pd pastes (35.3% Pd based on total weight of Pd and Ag), Showing D without $Cu_2Al_2O_4$ and Example 5 with 4.94% $Cu_2Al_2O_4$ based on the weight of Pd/Ag. The procedure of Example 1 was repeated to metallize an alumina substrate with the pastes set forth in Table III. Properties are also set forth in Table III. Improved adhesion characteristics were found in each instance with the present invention.

TABLE III

Silver and silver/palladium metallizations (wt. percent); adhesion evaluation

| | Showing C | Example 4 | Showing D | Example 5 |
|---|---|---|---|---|
| Silver powder | 61.78 | 99 parts composition of Showing C plus 1 part $Cu_2Al_2O_4$. | 40.5 | 97 parts composition of Showing D plus 3 part $Cu_2Al_2O_4$. Plus. |
| Palladium powder | | | 22.1 | |
| Glass frit B powder | 2.24 | | 2.3 | |
| Bismuth oxide | 8.96 | | 9.0 | |
| Organic vehicle | 27.02 | | 26.1 | |
| Copper aluminate | | 1.0 | | 3.0. |
| Adhesion, initial: Average of 32 | 2.6 | 5.1 | 3.8 | 6.2. |
| Low | 1.2 | 1.9 | 1.9 | 4.1. |
| High | 3.8 | 6.9 | 5.2 | 8.8. |
| Adhesion, aged 150° C./48 hours: | | | | |
| Average of 32 | 1.76 | 2.06 | 2.5 | 5.29. |
| Low | 0.8 | 1.2 | 1.4 | 3.6. |
| High | 2.6 | 3.1 | 3.8 | 7.4. |

Example 6; Showing E

In Example 6 an Ag/Pd paste (8.0% Pd based on total Pd and Ag) containing 4.53% $Su_3TiO_5$ based on Pd/Ag was used to make metallizations on an alumina substrate as in Example 1. The paste employed 97 parts of the paste of Showing A and 3 parts $Cu_3TiO_5$. This was evaluated along with the paste of Showing A in an aged adhesion test (48 hours/150° C.), with the results reported in Table IV as Example 6 and and Showing E.

TABLE IV

[Aged adhesion, 48 hr., 150° C.]

| | Example 6 | Showing E |
|---|---|---|
| Average of 24 | 5.3 | 4.1 |
| Low | 4.0 | 3.0 |
| High | 8.0 | 5.5 |

Examples 7–10

When the procedure of Example 1 is repeated using as the copper compound $CuO \cdot Fe_2O_3$, $CuO \cdot Mn_2O_3$, $CuO \cdot Co_2O_3$ or $Cu_2O \cdot Cr_2O_3$, similar improved results are obtained.

What is claimed is:

1. In metallizations of a finely divided powder of silver or palladium/silver and an inorganic binder, useful for application to dielectric substrates followed by firing to produce conductor patterns, improved metallizations which result in fired patterns of high adhesion to the substrate, said improved metallizations comprising, in addition to silver or palladium/silver and binder, a finely divided inorganic crystalline polynary oxide compound of copper which melts above 1000° C. in an amount effective to improve aged adhesion of the resultant conductor to the substrate.

2. Metallizations according to claim 1 dispersed in an inert liquid vehicle.

3. Metallizations according to claim 1 wherein the amount of said copper compound is 0.5–10% of the weight of the noble metal content of the metallization.

4. Metallizations according to claim 3 wherein said copper compound is $Cu_2Al_2O_4$.

5. Metallizations according to claim 3 wherein said copper compound is $Cu_3TiO_5$.

6. Metallizations according to claim 3 wherein said copper compound is $CuO \cdot Fe_2O_3$.

7. Metallizations according to claim 3 wherein said copper compound is $CuO \cdot Mn_2O_3$.

8. Metallizations according to claim 3 wherein said copper compound is $CuO \cdot Co_2O_3$.

9. Metallizations according to claim 3 wherein said copper compound is $Cu_2O \cdot Cr_2O_3$.

10. A dielectric substrate having fired thereon a metallization of claim 1.

11. A dielectric substrate having fired thereon a metallization of claim 3.

12. A dielectric substrate having fired thereon a metallization of claim 4.

13. A dielectric substrate having fired thereon a metallization of claim 5.

14. Metallizations according to claim 3 dispersed in an inert liquid vehicle.

15. Metallizations according to claim 4 dispersed in an inert liquid vehicle.

16. Metallizations according to claim 5 dispersed in an inert liquid vehicle.

References Cited

UNITED STATES PATENTS

| | | | |
|---|---|---|---|
| 2,837,487 | 6/1958 | Huttar | 252—514 |
| 2,950,996 | 8/1960 | Place | 252—514 |

JOHN D. WELSH, Primary Examiner

U.S. Cl. X.R.

106—1